(12) United States Patent
Park et al.

(10) Patent No.: US 8,053,326 B2
(45) Date of Patent: Nov. 8, 2011

(54) SEMICONDUCTOR DEVICE AND METHOD OF FABRICATING THE SAME

(75) Inventors: Jong-Bum Park, Icheon-si (KR); Han-Sang Song, Icheon-si (KR); Jong-Kook Park, Icheon-si (KR)

(73) Assignee: Hynix Semiconductor Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 12/318,504

(22) Filed: Dec. 30, 2008

(65) Prior Publication Data

US 2009/0289326 A1    Nov. 26, 2009

(30) Foreign Application Priority Data

May 21, 2008  (KR) .................. 10-2008-0047082

(51) Int. Cl.
    *H01L 21/20*     (2006.01)
(52) U.S. Cl. .............. 438/396; 438/397; 257/E29.343
(58) Field of Classification Search .................. 438/396, 438/397; 257/303, 306
    See application file for complete search history.

(56) References Cited

U.S. PATENT DOCUMENTS

| | | | |
|---|---|---|---|
| 2002/0140018 A1* | 10/2002 | Lee et al. ................. | 257/306 |
| 2005/0020066 A1* | 1/2005 | Choi et al. ................ | 438/683 |
| 2007/0007656 A1* | 1/2007 | Yoon ....................... | 257/758 |
| 2007/0015362 A1* | 1/2007 | Yun et al. ................. | 438/689 |
| 2007/0181929 A1* | 8/2007 | Juengling ................. | 257/306 |

FOREIGN PATENT DOCUMENTS

| | | |
|---|---|---|
| KR | 100418580 | 12/2002 |
| KR | 1020060031991 | 4/2006 |
| KR | 1020070023934 | 2/2007 |
| KR | 100714899 | 4/2007 |

OTHER PUBLICATIONS

Chinese Office Action for Chinese application No. 200910007226.3, citing the attached references.
Korean Notice of Allowance for application No. 10-2008-0047082, citing the attached references.
Korean Office Action dated Feb. 23, 2010 for Korean Patent Application No. 10-2008-0047082, citing the attached references. .

* cited by examiner

*Primary Examiner* — Phat Cao
*Assistant Examiner* — Nga Doan
(74) *Attorney, Agent, or Firm* — Lowe Hauptman Ham & Berner LLP

(57) ABSTRACT

A semiconductor device, includes: a first storage node contact plug penetrating a first interlayer insulation layer and partially protruding above the first interlayer insulation layer; a second storage node contact plug contacting the first storage node contact plug that protrudes above the first interlayer insulation layer; a storage node contacting a top surface of the second storage node contact plug; and a second interlayer insulation layer formed over the first interlayer insulation layer, wherein the second interlayer insulation layer surrounds an outer sidewall at a bottom region of the first storage node, and the second storage node contact plug, and wherein the first storage node contact plug protruding above the first interlayer insulation layer and the second storage node contact plug.

14 Claims, 10 Drawing Sheets

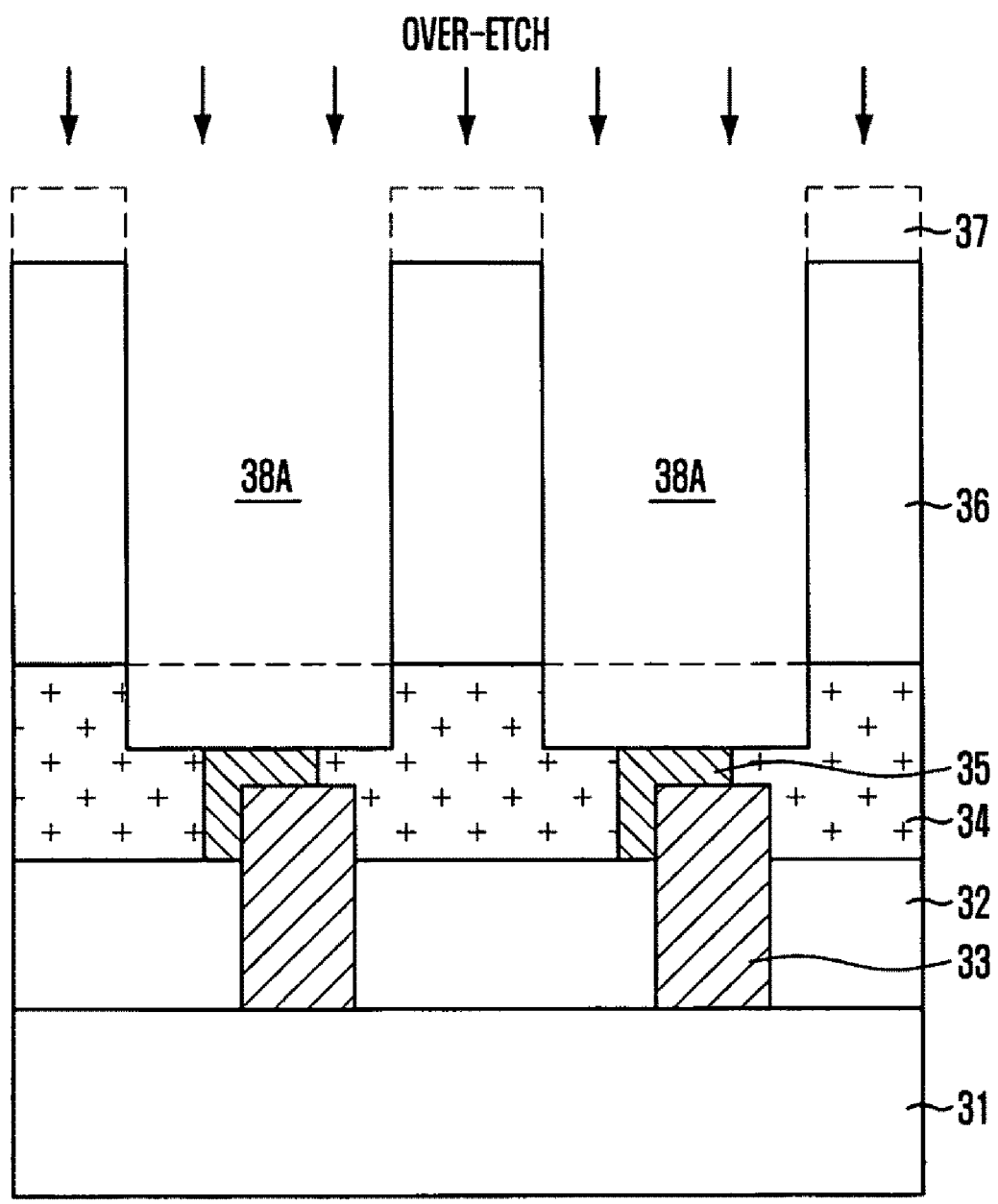

US 8,053,326 B2

SEMICONDUCTOR DEVICE AND METHOD OF FABRICATING THE SAME

CROSS-REFERENCE TO RELATED APPLICATIONS

The present application claims priority of Korean patent application number 10-2008-0047082, filed on May 21, 2008, which is incorporated herein by reference in its entirety.

BACKGROUND

The present application relates to a semiconductor device and a method for fabricating the same.

In order to obtain a required capacitance in a limited area, a metal layer such as a titanium nitride (TiN) layer has been used as an electrode of a capacitor e.g., a storage node (SN)), and a metal-insulator-metal (MIM) capacitor having a three-dimensional structure such as a cylinder or concave structure.

FIGS. 1A and 1B illustrate a method for fabricating a storage node of a typical semiconductor device, and FIG. 2 is a micrographic view illustrating limitations of the typical semiconductor device.

Referring to FIG. 1A, a first interlayer insulation layer 12 having a first storage node contact plug 13 is formed over a substrate 11 where a predetermined structure is formed, and a second interlayer insulation layer 14 is formed over the first interlayer insulation layer 12.

A second storage node contact plug 15 penetrates the second interlayer insulation layer 14 to contact with a top surface of the first storage node contact plug 13.

An etch stop layer 16 and a separation insulation layer 17 are sequentially formed over the second interlayer insulation layer 14, and a storage node hole 18 is formed by sequentially etching the separation insulation 17 and the etch stop layer 16 in order to expose a top surface of the second storage node contact plug 15.

A barrier metal layer (not shown) is formed along a surface of the storage node hole 18, and a thermal treatment process is performed to form an ohmic contact layer 19 over the second storage node contact plug 15. A storage node 20 is formed in the storage node hole 18.

Referring to FIG. 1B, the remaining separation insulation layer 17 is removed through a wet dip-out process to form the storage node 20 having a cylindrical type.

However, when the first interlayer insulation layer 12, the second interlayer insulation layer 14, and the separation insulation layer 17 are formed of an oxide layer, the second interlayer insulation layer 14 under the storage node 20 is etched to penetrate the storage node 20 through a chemical etchant during a wet dip-out process, as indicated by "A" in FIGS. 1B and 2. Thus, a defect such as a bunker 21 can occur. This bunker 21 generates a bridge between adjacent storage nodes 20 to cause a dual bit failure. Due to the bunker 21, an electrical short circuit phenomenon occurs between a metal interconnection and the storage node 20 during a subsequent metal interconnection process, or defective patterns may be formed during a mask process for forming the metal interconnection.

Additionally, since the degree of integration in a semiconductor device is increasing, a cell area where a capacitor may be formed is reduced and thus an aspect ratio of the storage node 20 is increased to obtain a sufficient electrostatic capacity in a limited cell area. Since the storage node 20 with a high aspect ratio causes deterioration of step coverage during a subsequent dielectric formation process, a fabricating yield of a semiconductor device is decreased. To overcome the above-mentioned limitations, a method for forming the thin storage node 20 of less than 300 Å is provided, but if the thickness of the storage node 20 is reduced, limitations due to the bunker 21 become worse because a chemical etchant penetrates more easily during a wet dip-out process.

SUMMARY

Embodiments of a semiconductor device are directed to preventing a defect such as a bunker.

In addition, embodiments are directed to providing a semiconductor device having a storage node with a thickness of less than 300 Å.

Moreover, embodiments are directed to providing a semiconductor device capable of increasing electrostatic capacity of a capacitor.

In accordance with at least one aspect, a semiconductor device includes: a first storage node contact plug penetrating a first interlayer insulation layer and partially protruding above the first interlayer insulation layer; a second storage node contact plug contacting the first storage node contact plug that protrudes above the first interlayer insulation layer; a storage node contacting a top surface of the second storage node contact plug; and a second interlayer insulation layer formed over the first interlayer insulation layer, the second interlayer insulation layer surrounding an outer sidewall at a bottom region of the first storage node, the first storage node contact plug protruding above the first interlayer insulation layer, and the second storage node contact plug.

In some embodiments, the first interlayer insulation layer includes an oxide layer and the second interlayer insulation layer comprises a nitride layer. The thickness of the second interlayer insulation layer may be less than that of the first interlayer insulation layer.

In some embodiments, the first storage node contact plug and the second storage node contact plug are formed of the same material, and the first storage node contact plug and the second storage node contact plug includes a polysilicon layer. The second storage node contact plug may have a zigzag structure where the second storage node contact plug overlaps the first storage node contact plug by a predetermined region.

The storage node may In some embodiments include any one of the group consisting of titanium nitride (TiN), tantalum nitride (TaN), hafnium ruthenium (HfN), ruthenium (Ru), ruthenium oxide (RuO$_2$), platinum (Pt), iridium (Ir), and iridium oxide (IrO$_2$), or a stack layer thereof.

In some embodiments the semiconductor device further includes an ohmic contact layer between the second storage node contact plug and the storage node. The ohmic contact layer may include metal silicide.

In accordance with another embodiment, a method for fabricating a semiconductor device includes: forming a storage node contact plug that penetrates an interlayer insulation layer; forming a separation insulation layer over the interlayer insulation layer; performing a main etch process to form an open region by selectively etching the separation insulation layer, the open region exposing a top surface of the storage node contact plug; performing an over-etch process to expand the open region by etching the storage node contact plug by a predetermined thickness at a bottom of the open region; forming a storage node in the open region; and removing the separation insulation layer. In some embodiments the main etch process and the over-etch process are performed in-situ.

The forming of the storage node contact plug may include: forming a first interlayer insulation layer that includes a first storage node contact plug; partially protruding the first storage node contact plug above the first interlayer insulation layer by recessing the first interlayer insulation layer; forming a second interlayer insulation layer to cover the first storage node contact plug that protrudes above the first interlayer insulation layer; forming a contact hole to partially expose the first storage node contact plug by selectively etching the second interlayer insulation layer; and forming a second storage node contact plug by filling the contact hole with a conductive layer.

In some embodiments, the first interlayer insulation layer and the separation insulation layer includes an oxide layer and the second interlayer insulation layer includes a nitride layer, wherein the thickness of the second interlayer insulation layer is, In some embodiments, less than a thickness of the first interlayer insulation layer.

The second storage node contact plug may have a zigzag structure where the second storage node contact plug overlaps the first storage node contact plug by a predetermined region. The first storage node contact plug and the second storage node contact plug may be formed of the same material. The first storage node contact plug and the second storage node contact plug may include a polysilicon layer.

The etch depth during the performing of the over-etch process may be less than a thickness of the second interlayer insulation layer.

In some embodiments the storage node includes one selected from the group consisting of titanium nitride (TiN), tantalum nitride (TaN), hafnium ruthenium (HfN), ruthenium (Ru), ruthenium oxide ($RuO_2$), platinum (Pt), iridium (Ir), and iridium oxide ($IrO_2$), or a stack layer thereof.

The method may further include forming an ohmic contact layer between the storage node contact plug and the storage node. The ohmic contact layer may include metal silicide.

In accordance with at least one other embodiment, a method for fabricating a capacitor of a semiconductor device, includes: forming a first interlayer insulation layer that includes a first storage node contact plug; partially protruding the first storage node contact plug above the first interlayer insulation layer by recessing the first interlayer insulation layer; forming a second interlayer insulation layer over the first interlayer insulation layer to cover the protruding first storage node contact plug; forming a contact hole to expose the first storage node contact plug by selectively etching the second interlayer insulation layer; forming a second storage node contact plug by filling the contact hole with a conductive layer; forming a separation insulation layer over the second interlayer insulation layer that includes the second storage node contact plug; forming an open region by selectively etching the separation insulation layer and the second storage node contact plug; forming a storage node in the open region; and removing the separation insulation layer.

The first interlayer insulation layer and the separation insulation layer may include an oxide layer and the second interlayer insulation layer comprises a nitride layer.

In at least one embodiment, the forming of the open region includes: performing a main etch process to form an open region by selectively etching the separation insulation layer, the open region exposing a top surface of the second storage node contact plug; and performing an over-etch process to expand the open region by partially etching the second storage contact plug at a bottom of the open region. The etch depth during the over-etch process may be less than a thickness of the second interlayer insulation layer.

BRIEF DESCRIPTION OF THE DRAWINGS

FIGS. 4A to 4G illustrate a method for fabricating a semiconductor device in accordance with the at least one embodiment.

DETAILED DESCRIPTION OF EMBODIMENTS

Other objects and advantages can be understood by the following description, and become apparent with reference to the following disclosed embodiments.

In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present.

Disclosed embodiments are of a semiconductor device and fabrication method capable of preventing a dual bit failure caused by defects such as a bunker in a capacitor.

The methods prevent a chemical etchant from penetrating a first interlayer insulation layer during a wet dip-out process. A second interlayer insulation layer providing a sidewall of a second storage node contact plug is formed of a material having a lower etch rate with respect to a first interlayer insulation layer, providing a sidewall of a first storage node contact plug and a separation insulation layer providing a sidewall of an open region (i.e., a storage node hole for forming a storage node), and also the second interlayer insulation layer surrounds the outer sidewall of a bottom region of a storage node.

Figure 1A:
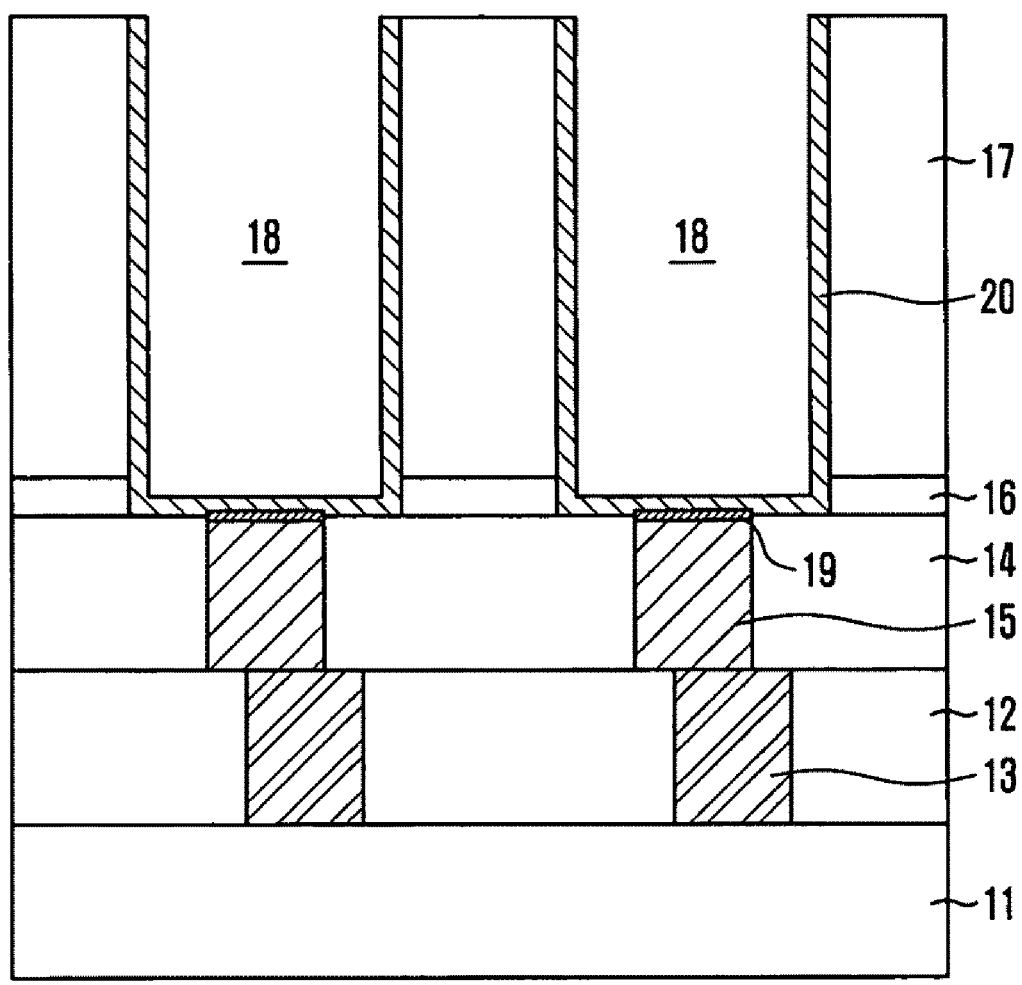
FIGS. 1A and 1B illustrate a method for fabricating a storage node of a typical semiconductor device.
Figure 1B:
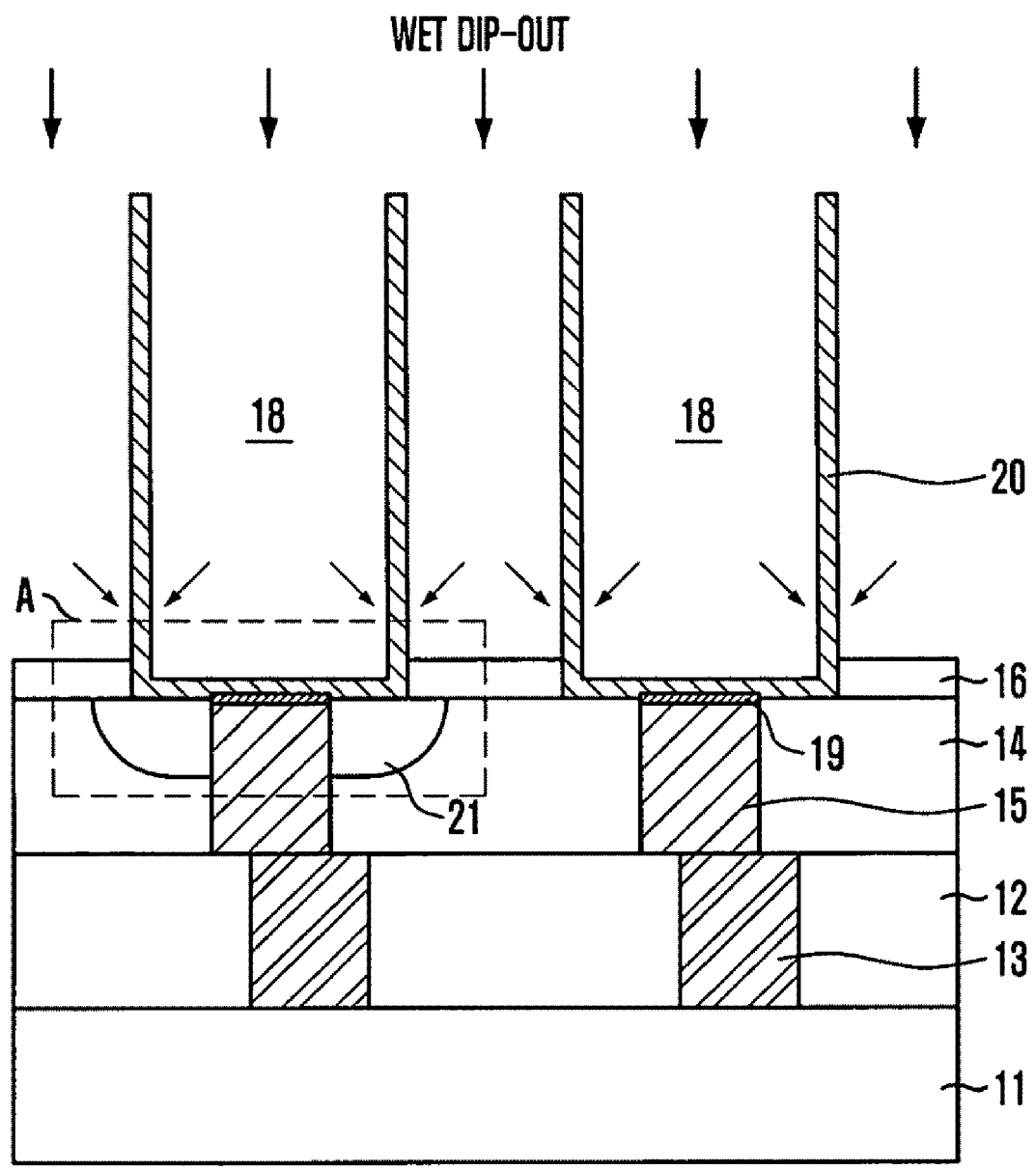
Figure 2:
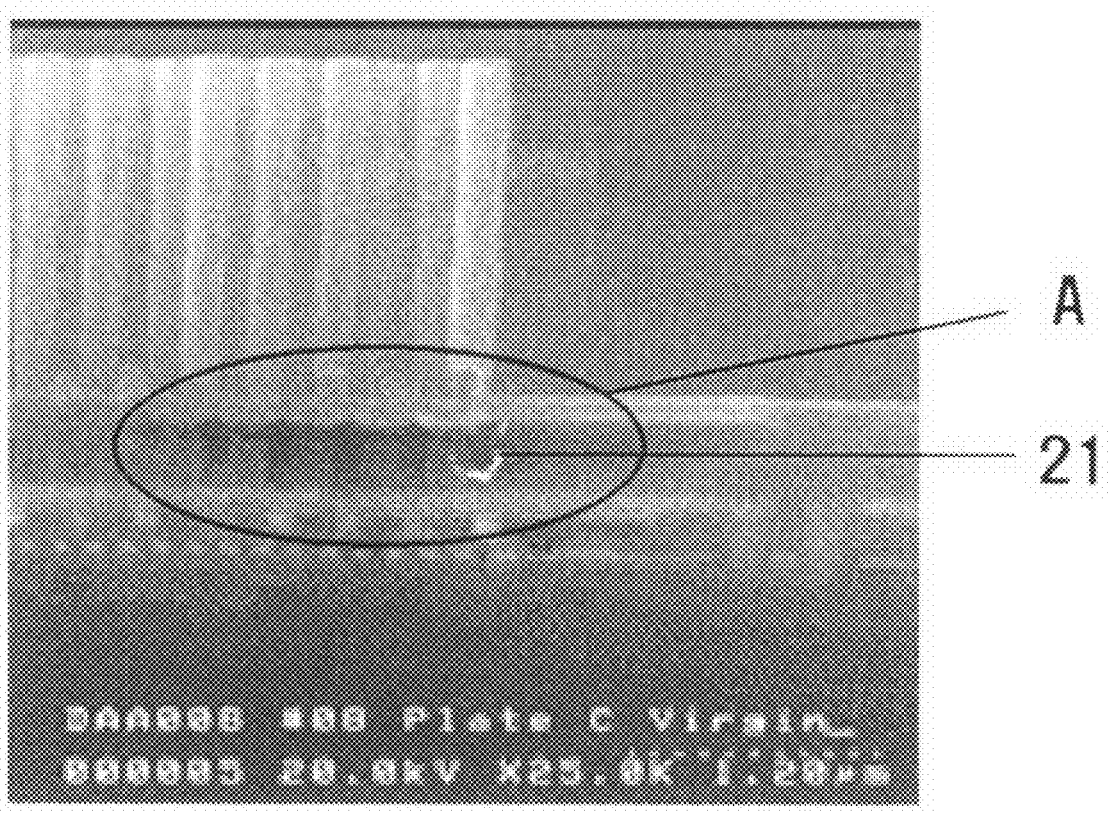
FIG. 2 is a micrographic view illustrating a limitation of the typical semiconductor device.
Figure 3:
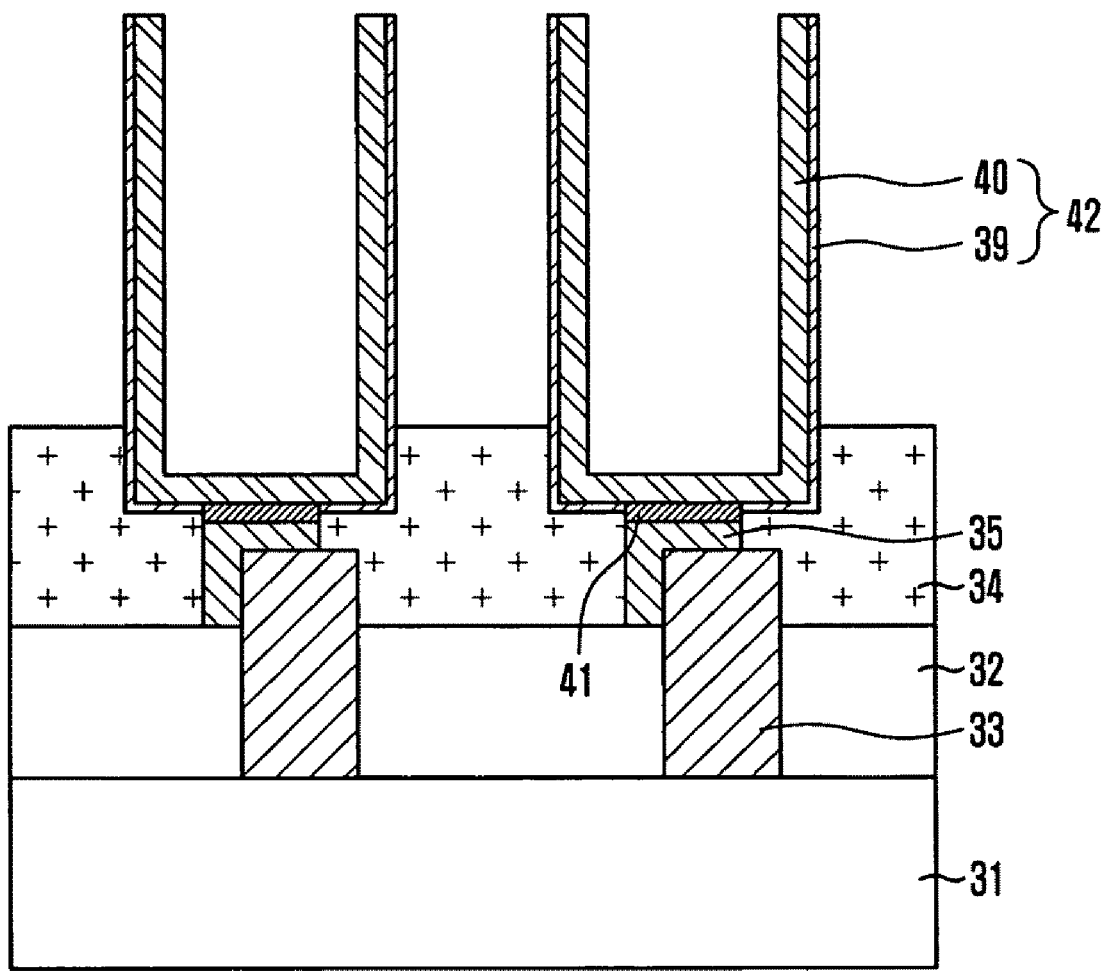
FIG. 3 is a cross-sectional view of a semiconductor device in accordance with at least one embodiment.

FIG. 3 is a cross-sectional view of a semiconductor device in accordance with at least one embodiment and depicts a first interlayer insulation layer 32, a first storage node contact plug 33, a second storage node contact plug 35, a storage node 42, and a second interlayer insulation layer 34. The first interlayer insulation layer 32 is formed over a substrate 31. The first storage node contact plug 33 penetrates the first interlayer insulation layer 32 and a portion of the first storage node contact plug 33 protrudes over the first interlayer insulation layer 32.

The second storage node contact plug 35 over the first interlayer insulation layer 32 contacts the first storage node contact plug 33 protruding above the first interlayer insulation layer 32. The storage node 42 contacting a top surface of the second storage node contact plug 35. The second interlayer insulation layer 34 over the first interlayer insulation layer 32 surrounds the outer sidewall at the bottom region of the storage node 42, the second storage node contact plug 35, and the first storage node contact plug 33 protruding over the first interlayer insulation layer 32. Additionally, in some embodiments the semiconductor device includes an ohmic contact layer 41 interposed between the second storage node contact plug 35 and the storage node 42.

The first interlayer insulation layer 32 is formed of an oxide layer selected from the group consisting of silicon oxide ($SiO_2$), Boron Phosphorus Silicate Glass (BPSG), Phosphorus Silicate Glass (PSG), Tetra Ethyle Ortho Silicate (TEOS), Un-doped Silicate Glass (USG), Spin On Glass (SOG), High Density Plasma (HDP), and Spin On Dielectric (SOD), or a stack layer thereof. The first interlayer insulation layer 32 may be formed of a stack layer where a SOD layer having excellent gap-fill characteristic and a HDP layer having excellent quality layer are sequentially stacked.

The second interlayer insulation layer 34 includes the second storage contact plug 35 to align the storage node 42 with the first storage node contact plug 33. The storage node 42 is aligned in a zigzag form on the second interlayer insulation layer 34. Accordingly, the second interlayer insulation layer 34 may be filled between the protruding first storage node contact plugs 33 and may cover the top surface of the first storage node contact plug 33 with a thickness between approximately 1,000 Å to approximately 1,500 Å.

In some embodiments, the second interlayer insulation layer 34 is formed thinner than the first interlayer insulation layer 32.

The second interlayer insulation layer 34 may be formed of a material having a lower etch rate with respect to the first interlayer insulation layer 32 in order to simplify fabricating processes of a semiconductor device. For example, if the first interlayer insulation layer 32 is formed of an oxide layer, the second interlayer insulation layer 34 may be formed of a nitride layer having a lower etch rate with respect to the oxide layer. A silicon nitride layer ($Si_3N_4$) may be used as a nitride layer. At this point, because the second interlayer insulation layer 34 is formed of a material having a lower etch rate with respect to the first interlayer insulation layer 32, in some embodiments an etch stop layer forming process is to protect the bottom structure of the storage node 42 during a wet dip-out process. Moreover, a bunker may be prevented from occurring in the first interlayer insulation layer 32 by preventing a chemical etchant from penetrating the first interlayer insulation layer 32 during the wet dip-out process.

Since the second interlayer insulation layer 34 has a structure surrounding an outer sidewall at the bottom region of the storage node 42, the storage node 42 does not collapse and a chemical etchant can be prevented from penetrating the first interlayer insulation layer 32.

The first storage node contact plug 33 is electrically connected to a predetermined region of the substrate 31 e.g., a landing plug (not shown), and serves to electrically connects a capacitor with a structure of the substrate 31.

The first storage node contact plug 33 protrudes by a thickness of approximately 500 Å to approximately 1,000 Å on the top surface of the first interlayer insulation layer 32 in order to increase a contact area for the second storage node contact plug 35.

As a semiconductor device becomes highly integrated, in order to form a capacitor in a limited area, in some embodiments, the second storage node contact plug 35 connects the storage node 42 with the first storage node contact plug 33 electrically and aligns them simultaneously. Additionally, the storage node 42 are arranged in a zigzag pattern, and the second storage node contact plug 35 may be formed in a zigzag pattern to overlap a predetermined region of the first storage node contact plug 33.

In some embodiments the first storage node contact plug 33 and the second storage node contact plug 35 are formed of the same material. This reason is to prevent a potential barrier from occurring therebetween. For reference, if the first storage node contact plug 33 and the second storage node contact plug 35 are formed of different materials, a potential barrier therebetween occurs and due to the potential barrier, charge transfer does not smoothly occurs. That is, due to the formed potential barrier, signal transmission therebetween is delayed such that electrical characteristics of a semiconductor device can be deteriorated.

The first storage node contact plug 33 and the second storage node contact plug 35 may be formed from one of a polysilicon layer, a metal material layer, and a conductive organic layer. In some embodiments, the metal material layer is formed of one of gold (Au), tungsten (W), aluminum (Al), titanium nitride (TiN), iridium oxide ($IrO_2$), Indium Tin Oxide (ITO), and Indium Zinc Oxide (IZO). The conductive organic layer may be formed of one of pentacene, tetracene, and anthracene. The first storage node contact plug 33 and the second storage node contact plug 35 may be formed of a polysilicon layer, which has an excellent interface characteristic with respect to a semiconductor material and is easily used for a formation process.

Additionally, since the second storage node contact plug 35 has a structure contacting the first storage node contact plug 33 protruding above the first interlayer insulation layer 32, a contact area between the first storage node contact plug 33 and the second storage node contact plug 35 can be increased and contact resistance therebetween can also be decreased.

In some embodiments, the storage node 42 is a cylindrical form formed of a staked layer where a barrier metal layer 39 and a conductive layer 40 for a storage node are sequentially stacked. In some embodiments, the storage node 42 has a structure where the barrier metal layer 39 surrounds the outer sidewall of the conductive layer for storage node 40 having a cylindrical form. At this point, the barrier metal layer 39 may have a thickness of approximately 20 Å to approximately 100 Å, and the conductive layer for storage node 40 may have a thickness of approximately 100 Å to approximately 500 Å. The storage node 42 may have a thickness of less than 300 Å (e.g., approximately 100 Å to approximately 300 Å) in order to increase electrostatic capacitance of a capacitor.

The barrier metal layer 39 serves to prevent mutual diffusion between a material of the conductive layer for a storage node 40 and a material of the second storage node contact 35, and also provides an ohmic contact layer 41 to reduce a contact resistance between the storage node 42 and the second storage node contact plug 35.

In some embodiments, the barrier metal layer 39 may be formed of one of refractory metals such as titanium (Ti), cobalt (Co), molybdenum (Mo), platinum (Pt), iridium (Ir), ruthenium (Ru), chrome (Cr), tantalum (Ta), and zirconium (Zr).

The conductive layer 40 for a storage node may be formed of at least one metal material selected from the group consisting of titanium nitride (TiN), tantalum nitride (TaN), hafnium nitride (HfN), ruthenium (Ru), ruthenium oxide ($RuO_2$), platinum (Pt), iridium (Ir), and iridium oxide ($IrO_2$), or a stack layer thereof.

The ohmic contact layer 41 interposed between the second storage node contact plug 35 and the storage node 42 serves to reduce a contact resistance therebetween. In some embodiments, the ohmic contact layer 41 is formed of metal salicide through reaction between the second storage node contact plug 35 formed of polysilicon and the barrier metal layer 39 during a thermal treatment process. For example, if the barrier metal layer 39 is formed of titanium (Ti), the ohmic contact layer 41 may be formed of titanium silicide ($TiSi_2$).

Since the second interlayer insulation layer 34 is formed of a material having a lower etch rate with respect to the first interlayer insulation layer 32, there is no necessary to additionally form an etch stop layer in order to protect the bottom structure of a storage node 42 during a wet dip-out process.

Therefore, the present invention can simplify fabricating processes of a semiconductor device.

Since the second interlayer insulation layer 34 is formed of a material having a lower etch rate selectivity with respect to the first interlayer insulation layer 32, a defect such as a bunker can be prevented during a wet deep out process without the forming of the additional etch stop layer. Therefore, limitations due to a bunker, e.g., an electrical short circuit phenomenon between the metal interconnection and the storage node 42, defective pattern occurrence during a mask process for forming a metal interconnection, and dual bit failure due to a bridge between adjacent storage nodes 42, can be prevented.

Because a defect such as a bunker can be prevented using the above disclosed process, the thickness of the storage node 42 can be reduced. Therefore, a step coverage can be obtained on the storage node 42 during a dielectric formation process and electrostatic capacitance of a capacitor can be improved by increasing the inner hole area of the storage node 42.

Because the second interlayer insulation layer 34 is formed to surround the outer sidewall at the bottom region of the storage node 42, the storage node 42 does not collapse during a wet dip-out process.

Moreover, since the first storage node contact plug 33 protrudes above the first interlayer insulation layer 32 in order to increase a contact area between the first storage node contact plug 33 and the second storage node contact plug 35, a contact resistance therebetween can be decreased, thereby improving an electrical characteristic of a semiconductor device.

Therefore, since a necessary electrostatic capacitance in a limited area of a capacitor in a semiconductor device can be obtained and a bunker formation can be prevented, reliability and a fabricating yield of the capacitor can be improved.

FIGS. 4A to 4G illustrate one embodiment of a method for fabricating a semiconductor device as described above.

Figure 4A:
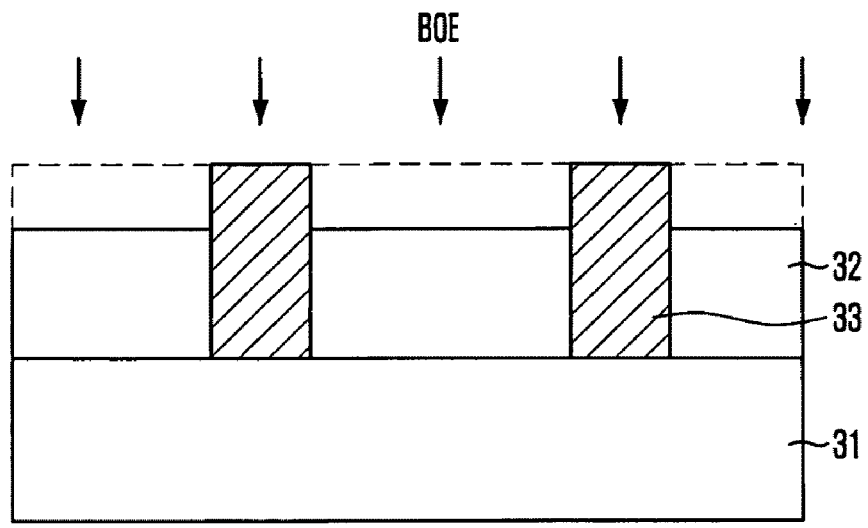

Referring to FIG. 4A, a first interlayer insulation layer 32 is formed on a substrate 31 having a predetermined structure, and a first storage node contact plug 33 is formed to be electrically connected to a predetermined area of the substrate 31 through the first interlayer insulation layer 32.

In some embodiments, the first interlayer insulation layer 32 is formed of one of SiO2, BPSG, PSG, TEOS, USG, SOG, HDP, and SOD, or a stack layer thereof. The first interlayer insulation layer 32 may be formed of a stack layer where a SOD layer having excellent gap-fill characteristic and a HDP layer having excellent quality layer are sequentially stacked.

The first storage node contact plug 33 may include one of a polysilicon layer, a metal material layer, and a conductive organic layer. The metal material layer may be formed of Au, W, Al, TiN, $IrO_2$, ITO, or IZO. The conductive organic layer may be formed of pentacene, tetracene, or anthracene. The first storage node contact plug 33 may be formed of a polysilicon layer, which has an excellent interface characteristic with respect to a semiconductor material and is easily used for a formation process.

Although not illustrated, before the first interlayer insulation layer 32 is formed, a transistor including a word line, a landing plug, and a bit line are formed on the substrate 31.

The first interlayer insulation layer 32 is recessed to partially protrude the first storage node contact plug 33 over the first interlayer insulation layer 32. At this point, the first interlayer insulation layer 33 may be recessed by a depth of approximately 500 Å to approximately 1,000 Å with respect to the top surface of the first storage node contact plug 33. The recessing process can be performed through a wet etch process using a buffered oxide etchant (BOE) solution or a hydrofluoric acid (HF) solution.

More specifically, the first storage node contact plug 33 partially protrudes above the first interlayer insulation layer 32 by approximately 500 Å to approximately 1,000 Å through the above mentioned process. In this way, a portion of the first storage node contact plug 33 protrudes over the first interlayer insulation layer 32 in order to increase a contact area between a second storage node contact plug, which will be formed through the subsequent process, and the first storage contact plug 33, such that a contact resistance therebetween can be reduced.

Figure 4B:
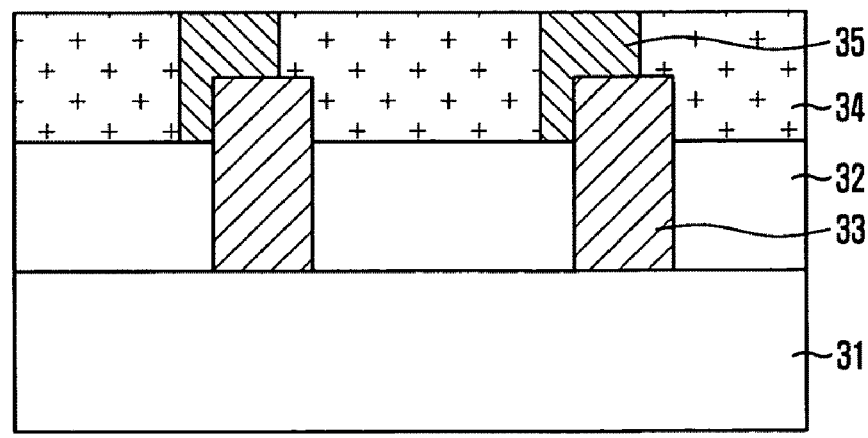

Referring to FIG. 4B, a second interlayer insulation layer 34 is formed on the first interlayer insulation layer 32 to cover the protruding first storage node contact plug 33. At this point, the second interlayer insulation layer 34 provides the sidewall of the second storage contact plug 35 in order for alignment between the first storage node contact plug 33 and the storage node, which will be aligned in a zigzag form through the subsequent process. Accordingly, the second interlayer insulation layer 34 may be filled between the protruding first storage node contact plugs 33 and may cover the top surface of the first storage node contact plug 33 with a thickness between approximately 1,000 Å to approximately 1,500 Å.

In some embodiments, second interlayer insulation layer 34 is formed thinner than the first interlayer insulation layer 32.

In order to simplify a fabricating process of a semiconductor device, in some embodiments, the second interlayer insulation layer 34 may be formed of a material having a lower etch rate with respect to the first interlayer insulation layer 32. For example, if the first interlayer insulation layer 32 is formed of an oxide layer, the second interlayer insulation layer 34 may be formed of a nitride layer having a lower etch rate with respect to the oxide layer. The nitride layer may include $Si_3N_4$.

In some embodiments, an etch stop layer of a nitride layer, i.e., an open region for forming the subsequent storage node, is formed on the second interlayer insulation layer 34 in order to protect a structure formed below the open region during a storage node hole forming process. Because the second interlayer insulation layer 34 is formed of a material having a lower etch rate with respect to the first interlayer insulation layer 32, the second interlayer insulation layer 34 serves as an etch stop layer to protect the bottom structure of the open region during the forming of the open region. Accordingly, at least some embodiments do not require an additional etch stop layer forming process, thereby simplifying a fabricating process of a semiconductor device.

On the other hand, due to the first storage node contact plug 33 protruding above the first interlayer insulation layer 32, a height difference may be formed on the top surface of the second interlayer insulation layer 34. Since this height difference has a negative influence on the subsequent process, it needs to be removed through a planarization process. At this point, the planarization process can be performed through chemical mechanical polishing (CMP) or an etch back process.

The second interlayer insulation layer 34 is selectively etched to form a contact hole for a second storage contact plug that partially expose the first storage node contact plug 33 protruding above the first interlayer insulation layer 32. A second storage node contact plug 35 is formed by filling the contact hole with a conductive layer. At this point, the second storage node contact plug 35 may be formed in a zigzag form to overlaps the first storage node contact plug 33 by a predetermined region. The second storage node contact plug 35 serves for alignment between the first storage node contact plug 33 and a storage node, which will be aligned in a zigzag form.

Because the second storage node contact plug 35 is formed to contact the first storage node contact plug 33 protruding above the first interlayer insulation layer 32, a contact area between the first storage node contact plug 33 and the second storage node contact plug 35 can be increased, thereby reducing a contact resistance therebetween.

Moreover, the second storage node contact plug 35 may be formed of one of the groups including a polysilicon layer, a metal material layer, and a conductive organic layer. The second storage node contact plug 35 may be formed of the same material (i.e., a polysilicon layer) as the first storage node contact plug 33. In this way, a contact resistance between the first storage node contact plug 33 and the second storage node contact plug 35 can be more reduced. This is because that there is no potential barrier therebetween because they are formed of the same material.

Figure 4C:
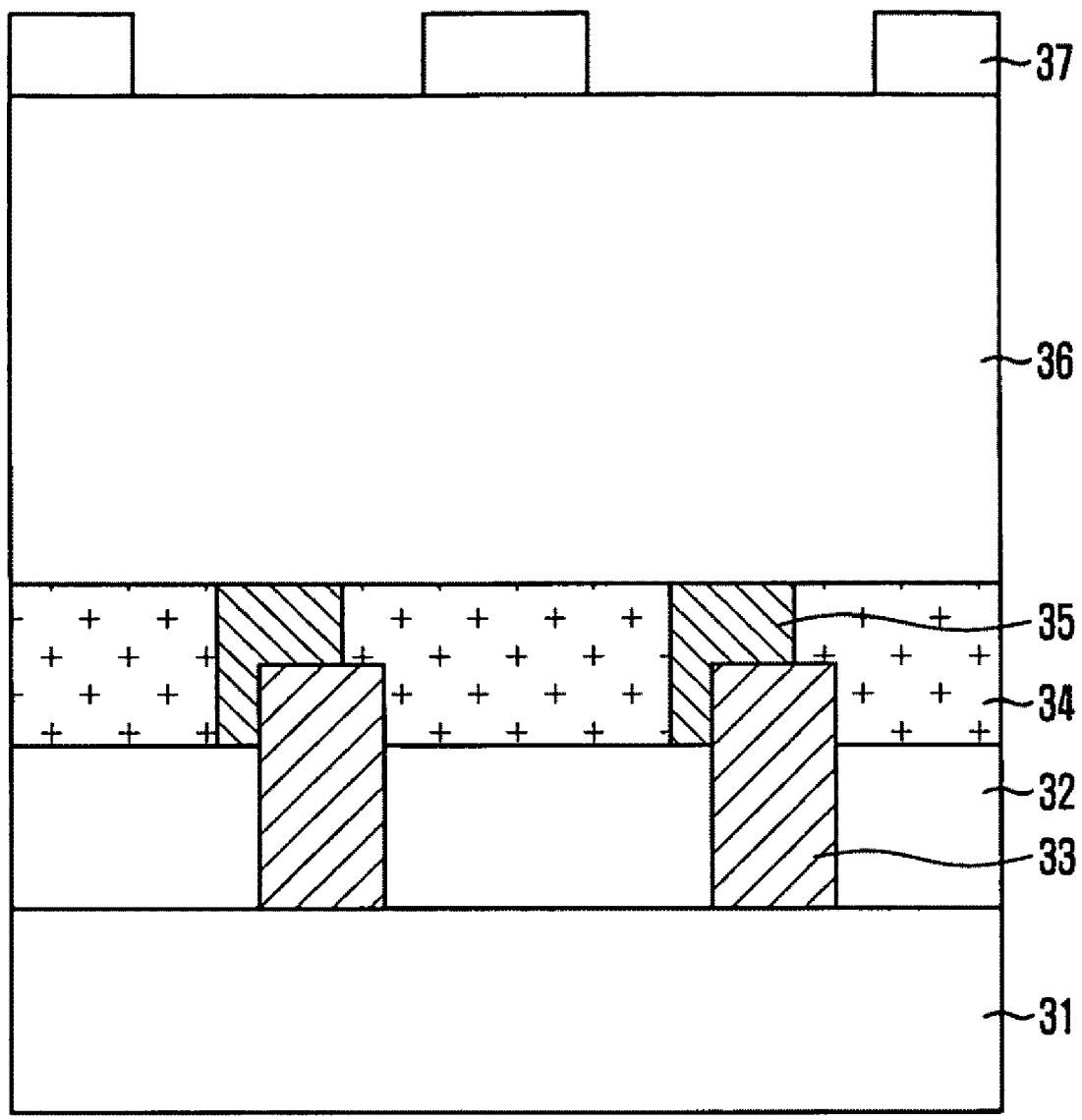

Referring to FIG. 4C, a separation insulation layer 36 is formed on the second interlayer insulation layer 34. At this point, the separation insulation layer 36 provides a three-dimensional structure where a storage node will be formed and may be formed with a thickness of approximately 10,000 Å to approximately 30,000 Å.

The separation insulation layer 36 may be formed of a material having an etch selectivity with respect to the second interlayer insulation layer 34. If the second interlayer insulation layer 34 is formed of a nitride layer, the separation insulation layer 36 may be formed of an oxide layer having an etch selectivity with respect of the nitride layer. More specifically, in some embodiments, the separation insulation layer 36 is formed of one of $SiO_2$, BPSG, PSG, TEOS, USG, SOG, HDP, and SOD, or a stack layer thereof.

An etch barrier pattern 37 is formed on the separation insulation layer 36 in order to form an open region. The etch barrier pattern 37 may be formed of one selected from the group consisting of an oxide layer, a nitride layer, an oxide nitride layer, and an amorphous carbon layer, or a stack layer thereof.

Figure 4D:
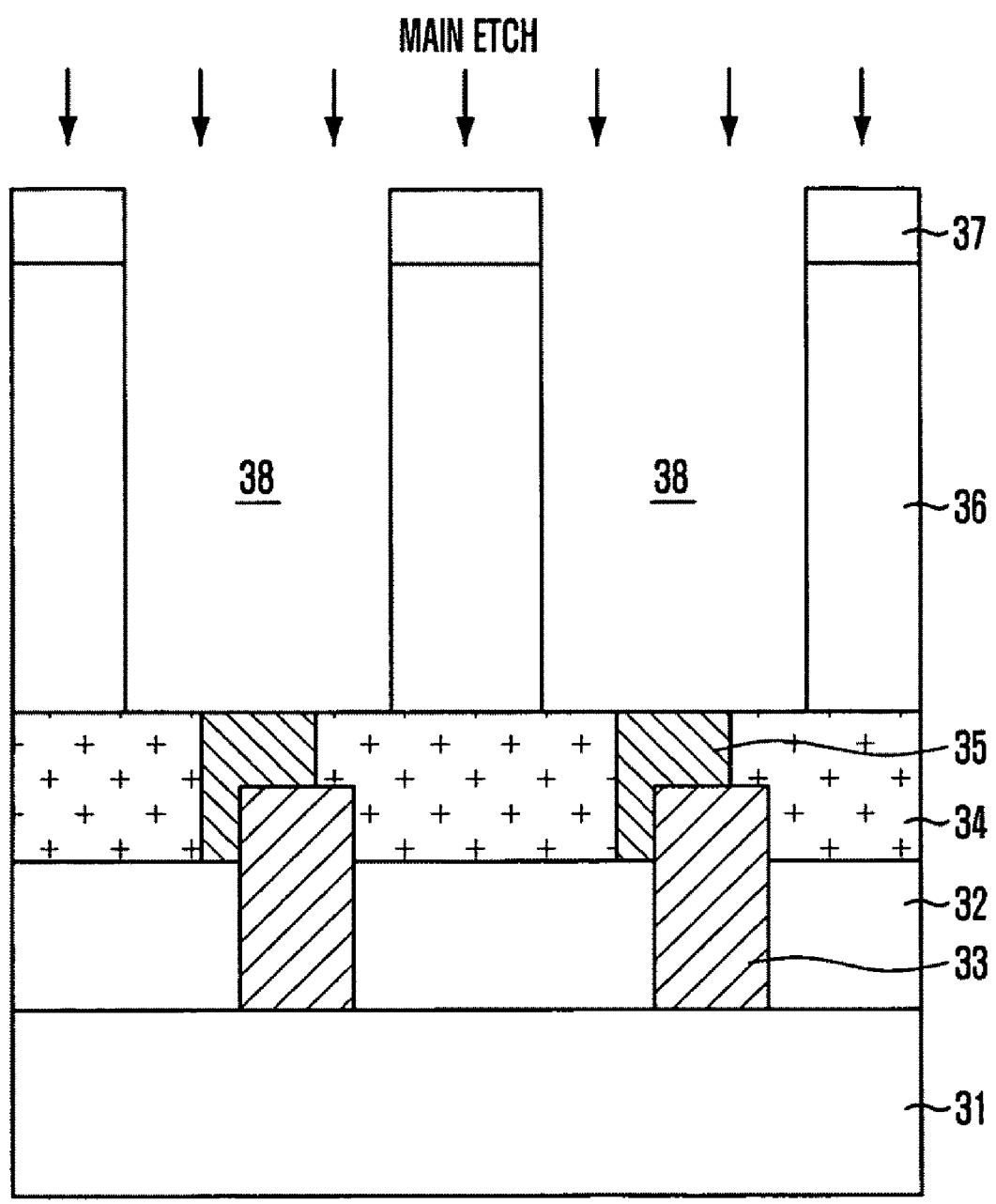

Referring to FIG. 4D, a main etch process is performed to etch the separation insulation layer 36 by using the etch barrier pattern 37 as an etch barrier and thus an open area 38 is formed to expose the top surface of the second storage node contact plug 35. In some embodiments, the main etch process is performed through a plasma etch process, using for example, an oxide layer as an etch target for separation insulation layer 36.

For example, if the main etch process is performed using a plasma etch method, one of plasma of gas mixed with methane fluoride gas, carbon fluoride gas, and argon gas, plasma of gas mixed with carbon fluoride gas and hydrogen gas ($H_2$), and plasma of gas mixed with methane fluoride gas, carbon dioxide gas ($CO_2$) can be used. Herein, the carbon fluoride gas includes $CF_4$, $C_2F_6$, and $C_3F_8$, and the methane fluoride gas includes $CHF_3$.

Referring to FIG. 4E, by using the etch barrier pattern 37 as an etch barrier, an over-etch process is performed to etch the second storage node contact plug 35 at the bottom surface of the open region 38 in order to expand the open region 38. A reference number 38A refers to the expanded open region.

The over-etch process is performed to allow the second interlayer insulation layer 34 to surround the outer sidewall at the bottom region of the storage node that is formed through the subsequent process, such that the storage node does not collapse during a wet dip-out process. Here, the second interlayer insulation layer 34, which is expose due to the open region 38 during the over-etch process, may be etched with a predetermined thickness in addition to the second storage node contact plug 35.

During the over-etch process, an etch depth may be less than the thickness of the second interlayer insulation layer 34 in order to prevent the first interlayer insulation layer 32 from being exposed. The over-etch process may be performed with an etch depth of approximately 300 Å to approximately 500 Å with respect to the top surface of the second interlayer insulation layer 34. The reason of this process is to prevent a defect such as a bunker during the subsequent insulation layer removing process, i.e., a wet dip-out process.

The over-etch process may be performed in-situ through the same etching method and etching gas as the main etching process. At this point, since the main etch process is performed targeting the oxide layer, the second interlayer insulation layer 34 may have an etch depth different from that of the second storage node contact plug 35 during the over-etch process. However, since the etch depth is very small in a range from approximately 300 Å to approximately 500 Å, even if there an etch depth difference in the second interlayer insulation layer 34 and the second storage node contact plug 35, i.e., there is a height difference therebetween, it does not affect characteristics of a semiconductor device.

The etch barrier pattern 37 is removed. In some embodiments, the etch barrier pattern 37 is completely removed while the main etch and over-etch processes are performed. In other embodiments, if the etch barrier pattern 37 remains after performing the main etch and over-etch processes, it is removed through an additional removing process and then the subsequent process may proceed.

Figure 4F:
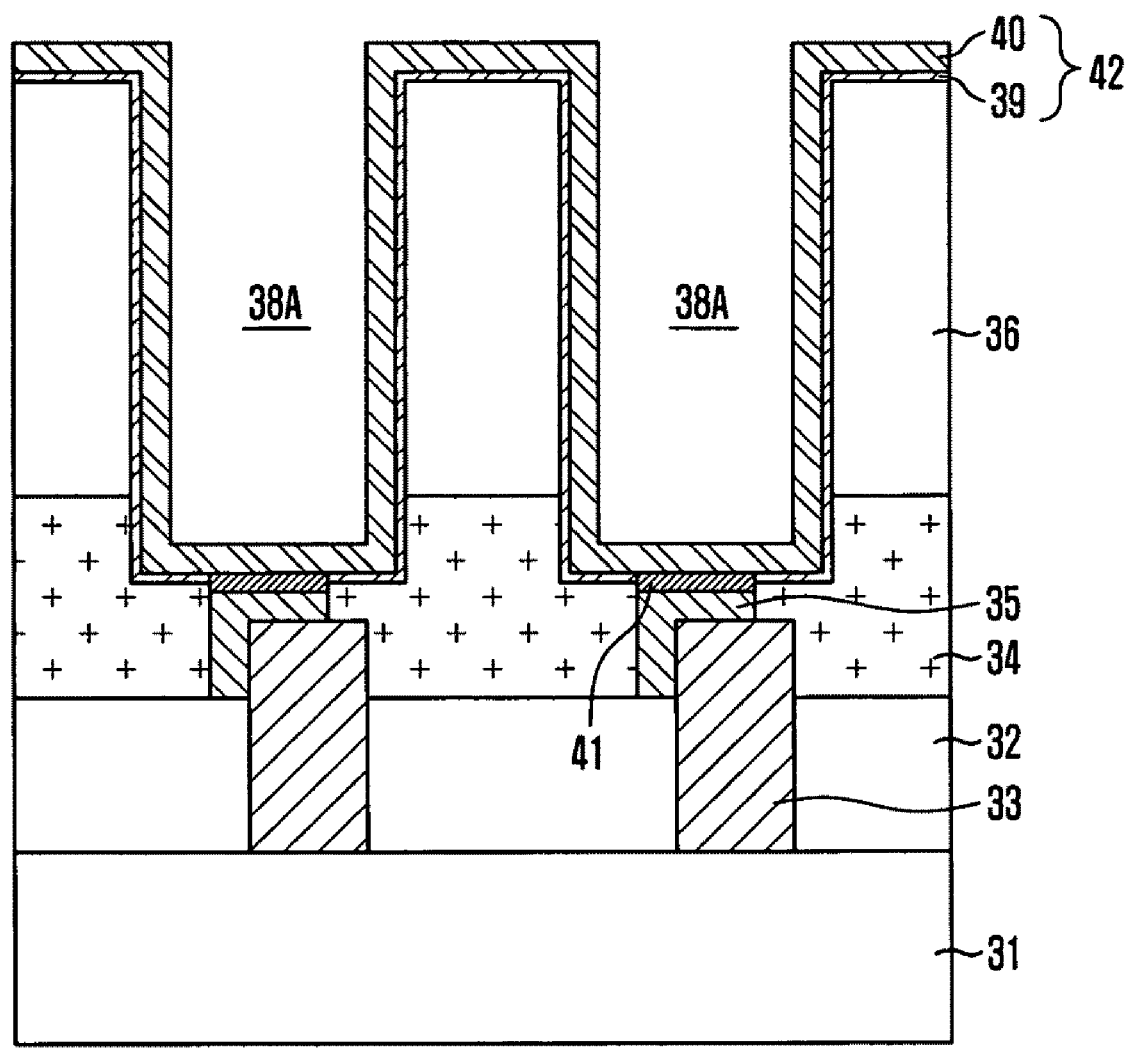

Referring to FIG. 4F, a barrier metal layer 39 is formed along the surface of the separation insulation layer 36 and the open region 38A. The barrier metal layer 39 serves to prevent mutual diffusion between a material constituting a storage node that will be formed through the subsequent process and a material constituting the second storage node contact plug 35.

In some embodiments, the barrier metal layer 39 is formed of a refractory metal such as Ti, Co, Mo, Pt, Ir, Ru, Cr, Ta, and Zr. Additionally, the barrier metal layer 39 may be formed with a thickness of approximately 20 Å to approximately 100 Å.

In order to reduce a contact resistance between the second storage node contact plug 35 and the storage node that will be formed through the subsequent process, an ohmic contact layer 41 is formed on the interface where the second storage node contact plug 35 and the barrier metal layer 39 contact. That is, the ohmic contact layer 41 is formed on the second storage node contact plug 35.

The ohmic contact layer 41 may be formed of metal silicide, e.g., TiSi2 by reaction between the second storage contact plug 35 formed of a polysilicon layer and the barrier metal layer 39 formed of a refractive metal layer, e.g., a titanium layer, through a thermal treatment process. At this point, the thermal treatment process for forming the ohmic contact layer 41 may be performed for approximately 10 seconds to approximately 300 seconds at a temperature of approximately 700° C. to approximately 900° C. under a nitrogen ($N_2$) atmosphere through rapid thermal anneal (RTA).

A conductive layer 40 for a storage node is formed on the barrier metal layer 39 along the surface of the separation insulation layer 36 and the open region 38A. At this point, the conductive layer 40 for a storage node may be formed of at least one metal selected from the group consisting of TiN, TaN, HfN, Ru, $RuO_2$, Pt, Ir, and $IrO_2$, or a stack layer thereof.

Additionally, the conductive layer 40 for a storage node may be formed with a thickness of approximately 100 Å to approximately 500 Å.

In order to increase an electrostatic capacitance of a capacitor, the sum of thicknesses of the barrier metal layer 39 and the conductive layer 40 for a storage node may be formed less than approximately 300 Å, e.g., between approximately 100 Å and approximately 300 Å.

The above mentioned barrier metal layer 39 and the conductive layer 40 for a storage node may be formed through Chemical Vapor Formation (CVD) or Atomic Layer Formation, (ALD).

Figure 4G:
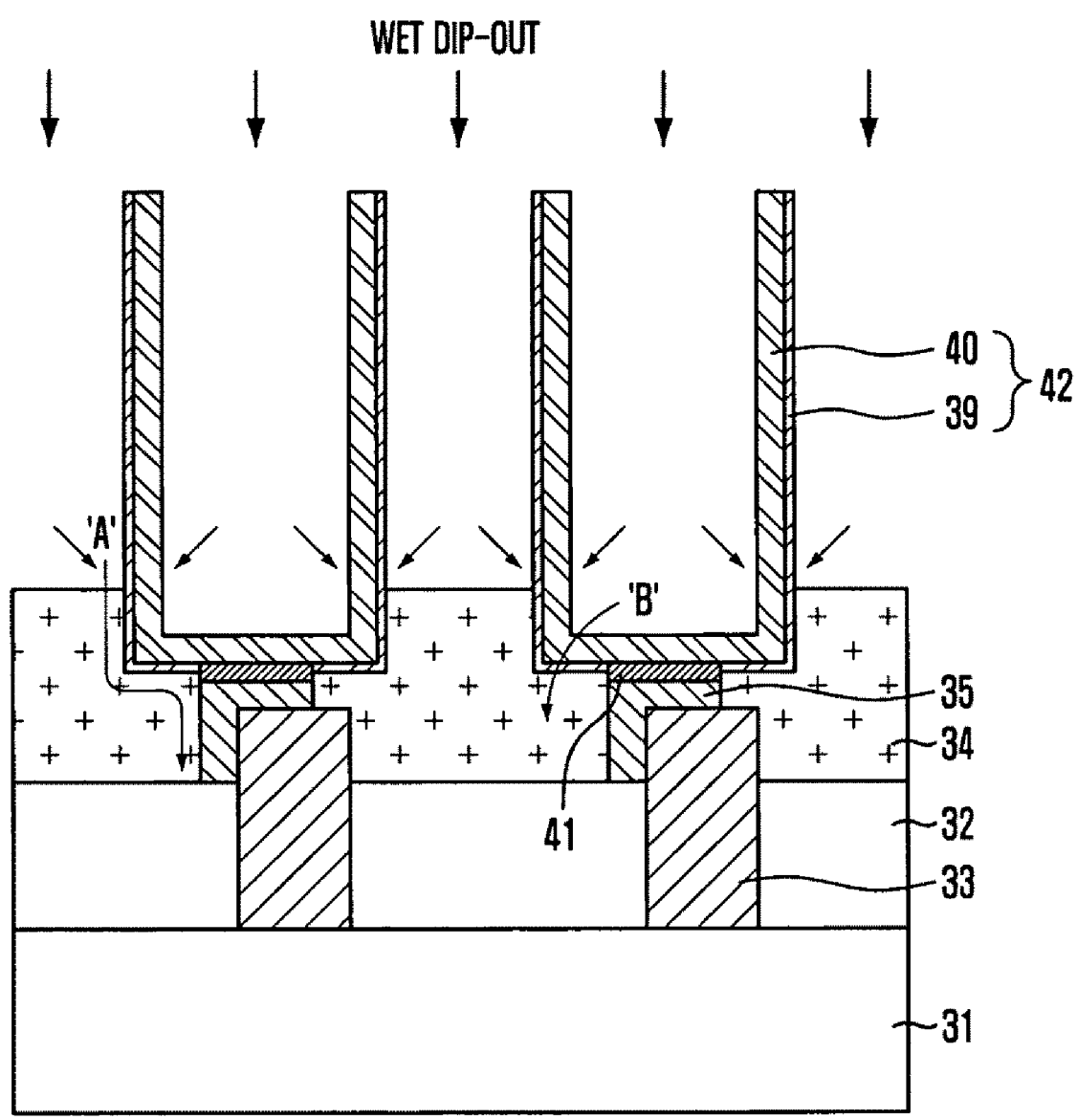

Referring to FIG. 4G, the conductive layer for storage node 40 and the barrier metal layer 39 formed on the separation insulation layer 36 are removed in order to expose the top surface of the separation insulation layer 36, such that a storage node 42 is formed by performing a storage node separation process for separating adjacent storage nodes 42. That is, the storage node 42 has a structure where the barrier metal layer 39 and the conductive layer 40 for a storage node are stacked.

The storage node separation process may be performed through a CMP or blanket-etch process. If the storage node separation process is performed through the blanket-etch process, the blanket-etch process is performed to prevent the damage of the bottom of the storage node 42 after the open region 38A is filled with a sacrificial layer.

A thermal treatment process is performed to improve a quality of the storage node 42. At this point, the thermal treatment process is performed for approximately 10 minutes to approximately 30 minutes under a nitrogen ($N_2$) atmosphere at a temperature of approximately 550° C. to approximately 650° C. in a furnace.

The remaining insulation layer 36 is then removed through a wet dip-out process to complete the formation of the cylindrical storage node 42. At this point, a BOE solution or a HF solution is used as chemical etchant during the wet dip-out process.

Even if no additional etch stop layer is formed, the second interlayer insulation layer 34 serves as the etch stop layer. Therefore, the bottom structure of the storage node 42 is not damaged during a wet dip-out process.

Since the second interlayer insulation layer 34 surrounds the outer sidewall at the bottom region of the storage node 42, even when a chemical etchant penetrates the storage node 42 during a wet dip-out process, the chemical etchant does not contact the first interlayer insulation layer 32 because of the second interlayer insulation layer 34. In this way, a bunker does not occur in the first interlayer insulation layer 32.

In cases of a path A of when the chemical etchant penetrates along the outer sidewall of the storage node 42 and a path B of when it penetrates the bottom of the storage node 42 that the second storage node contact plug 35 does not contact, since the second interlayer insulation layer 34 surrounds the outer sidewall at the bottom region of the storage node 42, its penetration path is increased, such that the chemical etchant does not penetrate the first interlayer insulation layer 32.

Additionally, because the second interlayer insulation layer 34 surrounds the outer sidewall at the bottom region of the storage node 42, the second interlayer insulation layer 34 supports the storage node 42 during the wet dip-out process, such that the storage node 42 does not collapse.

Although not illustrated, a dielectric is formed on the entire surface of the storage node 42. At this point, the dielectric is formed from one of $ZrO_2$, $TaON$, $Ta_2O_5$, $TiO_2$, $Al_2O_3$, $HfO_2$, $SrTiO_3$, and $(Ba,Sr)TiO_3$, or a stack layer thereof through CVD or ALD.

A plate electrode is formed on the dielectric. At this point, the plate electrode is formed of at least one metal selected from the group consisting of TiN, TaN, HfN, Ru, $RuO_2$, Pt, Ir, and $IrO_2$, or a stack layer thereof.

Because no additional etch stop layer is formed in order to protect the bottom structure of the storage node 42 during a wet dip-out process, and because the second interlayer insulation layer 34 serves as an etch stop layer, fabricating processes of a semiconductor device can be simplified.

Moreover, since the second interlayer insulation layer 34 is formed of a material having a lower etch rate with respect to the first interlayer insulation layer 32 and the separation insulation layer 36, a bunker does not occur during a wet dip-out process. Therefore, limitations due to a bunker can be prevented.

Because a defect such as a bunker can be prevented, the thickness of the storage node 42 can be reduced. Therefore, a step coverage can be ensured on the storage node 42 during a dielectric formation process and an electrostatic capacitance of a capacitor can be improved by increasing the inner hole area of the storage node 42.

Additionally, since the second interlayer insulation layer 34 is formed to surround the outer sidewall of the bottom region of the storage node 42, such that the storage node 42 does not collapse during a wet dip-out process.

Moreover, since the first storage node contact plug 33 protrudes above the first interlayer insulation layer 32 in order to increase a contact area between the first storage node contact plug 33 and the second storage node contact plug 35, a contact resistance therebetween is decreased, thereby improving an electrical characteristic of a semiconductor device.

Consequently, because a required electrostatic capacitance in a limited area of a capacitor of a semiconductor device can be obtained and defect formation such as a bunker can be prevented, reliability and a fabricating yield of the capacitor can be improved.

In accordance with the embodiments of the present invention, because a second interlayer insulation layer is formed of a material having a lower etch rate with respect to a first interlayer insulation layer and a separation insulation layer, it is unnecessary to additionally form an etch stop layer in order to protect the bottom structure of a storage node during a wet dip-out process. Therefore, a semiconductor device fabricating process can be simplified.

In addition, because a second interlayer insulation layer serves as an etch stop layer, damage of a first interlayer insulation layer can be prevented during a wet dip-out process, such that a bunker formation can be prevented. Therefore, limitations caused due to a bunker can be prevented.

As described above, because the embodiment of the present invention can prevent a defect such as a bunker, the thickness of a storage node can be decreased. That is, a storage node having a thickness of less than 300 Å can be formed. Thus, the present invention can obtain good step coverage when a dielectric formation process is performed on the storage node, and can increase an inner hole area of the storage node in order to improve electrostatic capacitance of a capacitor.

Furthermore, a second interlayer insulation layer surrounds an outer sidewall of the bottom region of a storage node, such that the storage node does not collapse during a wet dip-out process.

Moreover, a first storage node contact plug protrudes above a first interlayer insulation layer, such that a contact area between the first storage node contact plug and a second storage node contact plug is increased. Therefore, a contact resistance between the first storage node contact plug and the second storage node contact plug can be decreased, thereby improving electrical characteristics.

Because a sufficient electrostatic capacitance is obtained in a limited area of a capacitor in a semiconductor device and dual bit fail due to a bunker is prevented simultaneously, reliability and a fabricating yield of the capacitor can be improved.

While various embodiments have been described, it will be apparent to those skilled in the art that various changes and modifications may be made.

What is claimed is:

1. A method for fabricating a semiconductor device, the method comprising:
    forming a first interlayer insulation layer and a second interlayer insulation layer;
    forming a first storage node contact plug that penetrates said first interlayer insulation layer and a second storage node contact plug that penetrates said second interlayer insulation layer;
    forming a separation insulation layer over the second interlayer insulation layer;
    performing a main etch process to form an open region by selectively etching the separation insulation layer, the open region exposing a top surface of the second storage node contact plug;
    performing an over-etch process to expand the open region by etching the second storage node contact plug and the second interlayer insulation layer, thereby a bottom portion of the expanded open region extending laterally beyond side surfaces of the second storage node contact plug after the performance of the over-etch process;
    forming a storage node in the expanded open region; and
    removing the separation insulation layer,
    wherein the first interlayer insulation layer and the separation insulation layer comprise an oxide layer and the second interlayer insulation layer comprises a nitride layer.

2. The method of claim 1, wherein the forming of the first and second storage node contact plugs comprises:
    forming the first interlayer insulation layer including the first storage node contact plug;
    recessing the first interlayer insulation layer to partially protrude the first storage node contact plug above the first interlayer insulation layer;
    forming the second interlayer insulation layer to cover the first storage node contact plug protruding above the first interlayer insulation layer;
    forming a contact hole to partially expose the first storage node contact plug by selectively etching the second interlayer insulation layer; and
    forming the second storage node contact plug by filling the contact hole with a conductive layer.

3. The method of claim 1, wherein a thickness of the second interlayer insulation layer is less than a thickness of the first interlayer insulation layer.

4. The method of claim 2, wherein the second storage node contact plug has a zigzag structure and overlaps the first storage node contact plug by a predetermined region.

5. The method of claim 2, wherein the first storage node contact plug and the second storage node contact plug are formed of the same material.

6. The method of claim 5, wherein the first storage node contact plug and the second storage node contact plug comprise a polysilicon layer.

7. The method of claim 2, wherein an etch depth etched during the performing of the over-etch process is less than a thickness of the second interlayer insulation layer.

8. The method of claim 1, wherein the main etch process and the over-etch process are performed in-situ.

9. The method of claim 1, wherein each of the first and second storage node contact plugs includes any one selected from the group consisting of titanium nitride (TiN), tantalum nitride (TaN), hafnium nitride (HfN), ruthenium (Ru), ruthenium oxide ($RuO_2$), platinum (Pt), iridium (Ir), and iridium oxide ($IrO_2$), or a stack layer thereof.

10. The method of claim 1, further comprising forming an ohmic contact layer between the second storage node contact plug and the storage node.

11. The method of claim 10, wherein the ohmic contact layer comprises metal silicide.

12. A method for fabricating a capacitor of a semiconductor device, the method comprising:
    forming a first interlayer insulation layer including a first storage node contact plug;
    partially protruding the first storage node contact plug above the first interlayer insulation layer by recessing the first interlayer insulation layer;
    forming a second interlayer insulation layer over the first interlayer insulation layer to cover the protruding first storage node contact plug;
    forming a contact hole to expose the first storage node contact plug by selectively etching the second interlayer insulation layer;
    forming a second storage node contact plug by filling the contact hole with a conductive layer;
    forming a separation insulation layer over the second interlayer insulation layer including the second storage node contact plug;
    forming an open region by selectively etching the separation insulation layer, the second interlayer insulation layer, and the second storage node contact plug, thereby a bottom portion of the open region extending laterally beyond side surfaces of the second storage node contact plug;
    forming a storage node in the open region; and
    removing the separation insulation layer,
    wherein the first interlayer insulation layer and the separation insulation layer comprise an oxide layer and the second interlayer insulation layer comprises a nitride layer.

13. The method of claim 12, wherein the forming of the open region comprises:
    performing a main etch process to form an open region by selectively etching the separation insulation layer, the open region exposing a top surface of the second storage node contact plug; and
    performing an over-etch process to expand the open region by partially etching the second storage contact plug and the second interlayer insulation layer at a bottom of the open region.

14. The method of claim 13, wherein an etch depth etched during the over-etch process is less than a thickness of the second interlayer insulation layer.

* * * * *